United States Patent
Stemmer (10) Patent No.: US 8,294,462 B2
(45) Date of Patent: Oct. 23, 2012

(54) MAGNETIC RESONANCE SYSTEM AND METHOD FOR CORRECTION OF DISTORTION DUE TO CONTINUOUS MOVEMENT OF PATIENT TABLE

(75) Inventor: Alto Stemmer, Abenberg (DE)

(73) Assignee: Siemens Aktiengesellschaft, Munich (DE)

( * ) Notice: Subject to any disclaimer, the term of this patent is extended or adjusted under 35 U.S.C. 154(b) by 479 days.

(21) Appl. No.: 12/555,121

(22) Filed: Sep. 8, 2009

(65) Prior Publication Data

US 2010/0079141 A1    Apr. 1, 2010

(30) Foreign Application Priority Data

Sep. 8, 2008    (DE) .......................... 10 2008 046 267

(51) Int. Cl.
*G01V 3/00*    (2006.01)

(52) U.S. Cl. ........................................ 324/309; 324/307

(58) Field of Classification Search .................. 324/309, 324/307, 306, 312
See application file for complete search history.

(56) References Cited

U.S. PATENT DOCUMENTS

| | | | |
|---|---|---|---|
| 4,591,789 A | 5/1986 | Glover et al. | |
| 6,882,148 B2 * | 4/2005 | Pipe .............. | 324/307 |
| 6,967,479 B2 | 11/2005 | Polzin et al. | |
| 7,176,684 B2 * | 2/2007 | Patch et al. .............. | 324/307 |
| 7,417,430 B2 * | 8/2008 | Aldefeld et al. .............. | 324/309 |
| 7,436,178 B2 * | 10/2008 | Keupp et al. .............. | 324/318 |
| 7,535,226 B2 * | 5/2009 | Takahashi et al. .............. | 324/309 |
| 7,610,076 B2 * | 10/2009 | Riederer et al. .............. | 600/415 |
| 2006/0264735 A1 | 11/2006 | Stemmer | |
| 2008/0129289 A1 | 6/2008 | Stemmer et al. | |

OTHER PUBLICATIONS

Shankaranarayanan et al., "Helical Continuously Moving Table Axial Imaging With Radial Acquisitions", Magnetic Resonance in Medicine, 50 pp. 1053-1060, 2003.
Kruger et al—Continuously Moving Table Data Acquisition Method for Long FOV Contrast-Enhanced MRA and Whole-Body MRI.
Pipe "Motion Correction With Propeller MRI: Application to Head Motion and Free-Breathing Cardiac Imaging; Magnetic Resonance in Medicine" 42: pp. 963-969 (1999).
Johnson et al "Total-Body MR Imaging in as Little as 18 Seconds," Radiology, 202; 1997.
Dietrich et al, "Extending the Coverage of True Volume Scans by Continuous Movement of the Subject; The Robert Steiner Magnetic Resonance Unit," Hammersmith Hospital, Du Cane Road, London W120HS; London.
Lemieux et al, "Correcting for Scanner Errors, CT, MRI, Spect, and 3D Ultrasound," Medical Image Registration/Edited by Hajnal et al.

(Continued)

*Primary Examiner* — Louis Arana
(74) *Attorney, Agent, or Firm* — Schiff Hardin LLP (57) ABSTRACT

In a method and magnetic resonance (MR) for reduction and correction of image distortions that occur in the generation of MR images of an examination subject that is arranged on a table that is continuously driven through the MR system during the generation of the MR images and whose cause is the acquisition of MR data of an image at varying positions within the MR system, raw MR data are acquired in multiple segments with radial filling of k-space with the raw data, an intersection region in the k-space center is determined that is covered by multiple segments given the radial filling of the raw data in k-space, and the distortions are automatically calculated based on the intersection region of at least two different segments.

18 Claims, 6 Drawing Sheets

OTHER PUBLICATIONS

Reddy et al "An FFT-Based Technique for Translation, Rotation, and Scale-Invariant Image Registration," IEEE Transactions on Image Processing, vol. 5, No. 8, Aug. 1996.

Pipe, "Improved in-Plant Motion Correction for Propeller MRI," ISMRM 2001, abstract, 743.

Li, et al., "Methods for Efficient, High Quality Volume Resampling in the Frequency Domain," IEEE Visulation 2004, Austin, Texas, Oct. 2004 pp. 3-10.

O. Zenge et al., "High-Resolution Continuously Acquired Peripheral MR Angiography Featuring Partial Parallel Imaging GRAPPA," Magnetic Resonance in Medicine 56;859-865 (2006).

Zenge et al., "Whole-Body Magnetic Resonance Imaging Featuring Moving Table Continuous Data Acquisition with High-Precision Position Feedback," Magnetic Resonance in Medicine 54; 707-711 (2005).

Kruger et al., "Dual-Velocity Continuously Moving Table Acquisition for Contrast-Enhanced Peripheral Magnetic Resonance Angiography", Magnetic Resonance in Medicine 53; 110-117 (2005.

Madhuranthakam et al., "Time-Resolved 3D Contrast-Enhanced MRA of an Extended FOV Using Continuous Table Motion", Magnetic Resonance in Medicine 51;568-576 (2004).

Zhu et al, "Extended Field-of-View Imaging With Table Translation and Frequency Sweeping", Magnetic Resonance in Medicine 49:1106-11121 (2003).

Polzin et al., "Correction for Gradient Nonlinearly in Continuously Moving Table MR Imaging", Magnetic Resonance in Medicine 52; 161-167 92004).

Fautz et al., "Sliding Multislice (SMS): A New Technique for Minimum FOV Usage in Axial Continuously Moving Table Acquisitions", Resonance in Medicine 55:363-370 (2006).

Ludwig et al., "Adaptive Slice Shifting for Continuous Moving Table Acquisition Using hyperHASTE", ISMRM 2004, abstract#2671.

Weigel et al., "Adaption of HASTE for Continuous Moving Table Acquisition", ISMRM 2003, abstract#992.

Barkhausen et al., "Whole-Body MR Imaging in 30 Seconds with Real-Time True FISP and a Continuously Rolling Table Platform: Feasibility Study", Radiology 2001; 220:252-256.

\* cited by examiner

MAGNETIC RESONANCE SYSTEM AND METHOD FOR CORRECTION OF DISTORTION DUE TO CONTINUOUS MOVEMENT OF PATIENT TABLE

BACKGROUND OF THE INVENTION

1. Field of the Invention

The present invention concerns a method for reducing and correcting image distortions that occur in the creation of MR images of an examination subject that is arranged on a table that is moved continuously through the MR system during the creation of the MR images, wherein the cause of the distortions is the acquisition of MR data of an image at varying positions within the MR system. The invention is in particular (but not exclusively) suitable for the correction of nonlinearities of the gradient fields that are switched in addition to the basic magnetic field B0 during the image generation.

2. Description of the Prior Art

In magnetic resonance tomography (MRT), a gradient field that ideally is linear, is superimposed on a static magnetic field that ideally is uniform, in order to be able to detect the position of protons in a subject by the linear spatial change of its precision frequency. In the image reconstruction from the acquired raw data, it is now assumed that the entire field consists of the static magnetic field and that the gradient fields vary linearly. Any deviation from this linear change leads to an incorrect localization of the proton in the MR image. In MRT acquisitions with fixed table position, the localization errors manifest in deformation artifacts ("pixel shifts") and local intensity fluctuations. The causes for the non-homogeneity of the static field or the nonlinearity of the gradient field can be system imprecisions, eddy currents, local shieldings of the protons (known as chemical shift artifacts) or susceptibility effects at tissue boundaries, for example. The linearity of the entire magnetic field typically depends on the position within the MR system. The basic magnetic field B0 is essentially constant and the gradient field is essentially linear within a spherical or cylindrical region around what is known as the isocenter of the magnet.

A known method for covering larger examination regions is to organize the slices of the MR images to be acquired into multiple groups of adjacent slices; to drive the table on which the examination subject is arranged through the MR system in steps such that the center of a group respectively comes to be situated in the isocenter of the magnet; and to acquire raw MR data from the group when the table is stationary. The individual groups are thus acquired with various table positions. The main disadvantage of this method is that adjacent slices that are associated with different groups are acquired at opposite ends of the isocenter. Discontinuities result at the edges in the assembled images due to the unavoidable inhomogeneities and nonlinearities, which hinders the diagnosis.

Furthermore, it is known to acquire MR images as the table is driven continuously through the MR system. This technique yields good results (i.e. images) when the images are acquired with what is known as a single shot technique in which the entire raw data space (longitudinal section) is acquired in a single excitation of the magnetization in a very short time. If the continuous table feed is used in connection with other imaging sequences in which k-space is not read out after a single excitation (for example in fast spin echo or gradient echo sequences), the data are necessarily acquired at different positions within the MR system, wherein these different positions have different inhomogeneities and nonlinearities. This can lead to artifacts such as ghosting or a blurring, wherein the artifacts are greater the higher the table speed.

U.S. Pat. No. 4,591,789 describes a method for correcting nonlinearities of the gradient coil. U.S. Pat. No. 6,967,479 generalizes this method for a measurement with continuous table movement. It is common to both methods that the correction factors (thus the deviation from the linearity at a specific position within the MR system) must be known before the measurement. The calculation of the correction factors is also executed in U.S. Pat. No. 4,591,789 for only a specific design of the gradient coil. The embodiment from U.S. Pat. No. 6,967,479 is limited to a measurement with continuous table movement in which the frequency coding runs in the movement direction of the table during the image acquisition.

SUMMARY OF THE INVENTION

An object of the present invention is to provide a method to reduce image artifacts in the generation of MR images with continuous table movement as a result of the acquisition of MR data at various positions within the MR system, without prior knowledge and without limitation of the hardware that is used.

This object is achieved according to the invention by a method for correction of distortions that occur in the generation of MR images of an examination subject that is arranged on a table that is continuously driven through the MR system, their cause being the acquisition of MR data of an image at varying positions within the MR system, wherein the raw MR data are acquired in multiple segments with a radial k-space trajectory. A non-punctiform intersection region that is covered by multiple segments results in the k-space center, due to the radial acquisition technique. The deformation of the one segment relative to the other segment can be determined using the intersection region, or using the raw data of at least two different segments acquired in the intersection region. The raw data in the intersection region are acquired at varying positions along the movement direction of the table (the z-axis). The distortions (whose cause is a nonlinearity of the gradient coil, for example) can be determined by a comparison of the data in the intersection region and can subsequently be taken into account in the image reconstruction.

For this purpose, a reference segment and an additional segment are advantageously determined (designated or identified), and the intersection region of the at least one additional segment and the reference segment are compared with one another in order to determine from the comparison, the distortion of the additional segment relative of the reference segment.

The at least one additional segment is advantageously initially aligned parallel to the reference segment in order to be able to compare the two intersection regions, and a correction measure (for example an affine correction measure), with which the at least one additional segment is corrected, can be calculated from the comparison. Since the various segments are acquired at different angles in the radial acquisition technique, the additional segment can be compared particularly simply with the reference segment when the rotation around the k-space center of the additional segment relative to the reference segment has been canceled beforehand.

The comparison of the intersection regions of the reference segment and the at least one additional segment can ensue in k-space or in image space. In one embodiment of the invention, the comparison ensues in image space. For this purpose, the raw data of the two segments are initially multiplied with a filter function. The filter function is selected such that data points outside of the intersection region are multiplied with zero. The filtered data of the two segments are subsequently transformed into image space by a Fourier transformation to create a filtered reference image and the at least one additional filtered image. In the following the images that are generated in such a manner are called "filtered images" because they are created on the basis of raw data that have been low-pass-filtered in k-space to extract the data range in k-space that lies in the intersection region. In the special case of rectangular k-space segments whose short edge length is L, the intersection region is encompassed by a circle with the diameter L around the k-space center.

In one embodiment it is assumed that the imperfection of every real MR system leads to an enlargement or reduction of the image that is calculated form the data of a segment. It is thus assumed that the image calculated from the real data of a segment correspond (except for a scaling factor) to the ideal image that is calculated from the data of a corresponding segment that was acquired with a fictitious MR system with homogeneous $B_0$ field and linear gradient system. In this case the correction measure is a scaling factor, wherein it is assumed that the image $I_j(x,y)$ that is calculated from the data of a segment with the index j is a scaled replica of the ideal image $I_{j,ideal}(x,y)$ that was created with a virtual, perfect system.

$$I_{j,ideal}(x,y)=I_j(a_jx,a_jy), 1 \leq j \leq N_B, \quad (1)$$

wherein $N_B$ is the number of segments per image. This (a priori unknown) scaling factor $a_j$ depends on the z-position in the MR system at which the segment j was acquired, wherein it is assumed from this that the travel path of the bed during the acquisition of a segment is small relative to the movement path of the table during the entire acquisition time of an image. If the scaling factor $a_j$ is now known for all images, i.e. if the correction measure is known for every segment, then every segment can be corrected with the correction measure calculated for this segment, and MR images in which the deformations as a result of the acquisition at different positions within the MR system are significantly reduced can be calculated based on these corrected segments.

The data in the intersection region of the segments are acquired with every segment, thus Nb times. If movements of the examination subject or physiological processes between the acquisition of different segments are disregarded, images that are calculated from the data in the intersection region of a respective segment thus differ only in the cited scaling (and the known rotation of the segments relative to one another). The relative scaling of the associated segments can thus be concluded from the comparison of two of these respective images. A reference segment with which the remaining Nb−1 segments are compared in pairs is advantageously selected. The segment that, during the acquisition, exhibits a z-position that has the least z-distance from the isocenter of the gradient system of the MR system is advantageously selected as a reference segment. It is expected of this that it comes closest to the aforementioned ideal (but not available) segment. The scaling factor of the reference segment can therefore be set to one.

The scaling factor of a segment is advantageously determined with a search algorithm from a set of scaling factors (i.e., the search range or search space). For this purpose, a scaling factor is respectively selected from the search space in a step-by-step or iterative method, and the filtered image of the segment is scaled via an interpolation with the scaling factor. For example, a correlation measure between the image scaled with the scaling factor and the filtered image of the reference segment is subsequently calculated. The scaling factor for the at least one additional segment is determined by maximizing the correlation measure as a function of the scaling factor.

In the previously described embodiment, a single correction measure was determined per segment. If it is assumed that the nonlinearity of the gradient coil is the significant cause of the distortions, and if it is additionally assumed that the slice orientation proceeds axially and the movement path of the bed proceeds in the z-direction (thus parallel to the image normal), this assumption means that only the nonlinearity of the gradient coil $G_z$ is corrected. Nonlinearities of the gradient coils $G_x$ and $G_y$ lead to distortions in the image plane under the cited assumptions. These can be at least partially corrected in another embodiment. For this, the image plane of the filtered image of a segment is divided into different regions and a scaling factor is respectively calculated for the different regions of the image. If the scaling factor is calculated in the image region, for example, the image could be divided up into multiple concentric rings around the common isocenter of the gradient coils $G_x$ and $G_y$. The determined scaling factor is henceforth a function of the segment index and the image region. In order to prevent discontinuities of the corrected image at the region borders, in the correction of a specific pixel of the segment a scaling factor is used that, for example, is a linear combination of the scaling factor that was determined for the image region to which the pixel belongs and the scaling factor that was determined for an adjacent image region.

In addition to the distortions whose cause is the data acquisition at different positions within the MR system, a movement of the examination subject that occurs between the acquisition of the different segments can be determined from the data in the intersection region in k-space. For example, a rotation and a two-dimensional translation can be determined in addition to the scaling factor. It is advantageous to conduct the detection in k-space since there the scaling and rotation can be determined separate from the translation.

Furthermore the use of the method together with the utilization of multiple reception coils is possible, wherein the different coils typically have a very small sensitive volume. In one embodiment, an individual scaling factor can be determined for every segment and for every acquisition channel of the MR signal detection unit. The calculated scaling factor of an acquisition channel is then dependent on the nonlinearity of the gradient coils in the sensitivity range of the acquisition channel, for example. The determination of different scaling factors for different acquisition channels is thus an additional method in order to account for nonlinearities of the gradient coil in the image plane. The segment data of an acquisition channel thus are corrected with their individual scaling factor before the combination of the acquisition channels.

A radial acquisition technique of k-space is known as the PROPELLER technique/BLADE technique. In this technique, among other things, a phase correction of the individual segments is implemented. In a preferred embodiment, this phase correction is implemented before the determination and correction of the distortions.

Given the maximum search of the correlation measure, an iteration method can be used to reduce the computation effort. For example, the search space can be scanned with a coarse increment in a first iteration step. In every further iteration step, the increment is refined relative to the preceding iteration step and the search range is limited by the local maxima of the earlier iteration steps. Such a "coarse to fine search" significantly reduces the numerical effort relative to an exhaustive search of the entire search space.

The invention furthermore concerns a method for acquisition of MR images of an examination subject that is arranged on a table that is continuously driven through the MR system during the generation of the MR images, wherein the MR images are acquired with the PROPELLER technique, meaning that k-space is acquired in segments that respectively lead through the k-space center, wherein every segment consists of multiple parallel phase coding steps. The individual segments are rotated counter to one another around the k-space center. Significant advantages result from the combination of the PROPELLER technique with a continuous table feed in comparison to the combination of a conventional acquisition with a continuous table feed. For example, in multi-shot turbo-spin echo imaging multiple echoes are generated at a short time interval after a single excitation pulse. Each echo codes one phase coding line in k-space. In conventional Cartesian imaging, in general no contiguous region in k-space is coded with an echo train (an echo train comprises all echoes that are generated after an excitation pulse). Rather, an interleaved acquisition scheme is selected in which corresponding echoes of different echo trains code adjacent lines in k-space. The reason is the unavoidable T2-induced amplitude decay along the echo train. The time interval between echo trains (between 2000 ms and 20000 ms in T2-weighted imaging) is now orders of magnitude longer than the timer interval of two successive echoes within an echo train (4-20 ms). Given continuous table movement along the z-axis of the MR system during the acquisition, a linear correlation now exists between the time that passes between the acquisition of two k-space lines and the spatial separation of the positions within the MR system at which the k-space lines are acquired. The longer the time interval, the larger the traversed distance of the patient bed, and in general the greater the inconsistencies whose cause lies in imperfections in the real MR system (for example nonlinearities of the gradient coil). In the interleaved acquisition scheme of conventional T2 imaging, these inconsistencies lead to a periodic modulation of k-space, which in turn leads to multiple ghosts in image space. In contrast to this, in PROPELLER imaging a contiguous segment in k-space is filled with an echo train. Different echo trains fill different segments that all contain the k-space center and are rotated counter to one another. Given continuous table movement, the imperfections of the MR system primarily lead to inconsistencies between the segments. In contrast to this, the inconsistencies between the lines of a segment are small and vary continuously along the phase coding direction of the segment. The inconsistencies between the segments—insofar as they are not corrected—lead to a "blurring" in image space, and therefore to a resolution loss. However, this generally hinders the diagnosis far less than the ghosts in conventional imaging.

The invention furthermore concerns a device for correction of distortions whose cause is the data acquisition at different positions within the MR system. The MR system is equipped with a pulse sequence control unit to acquire the raw MR data with the technique for radial acquisition of k-space in multiple segments, and with an image computer to determine an intersection region in the k-space center that is covered by multiple segments in the acquisition of raw data, wherein the image computer calculates correction measures based on the intersection region. The device—and in particular the image computer—operates as described above in detail.

DESCRIPTION OF THE PREFERRED EMBODIMENTS

Figure 1:
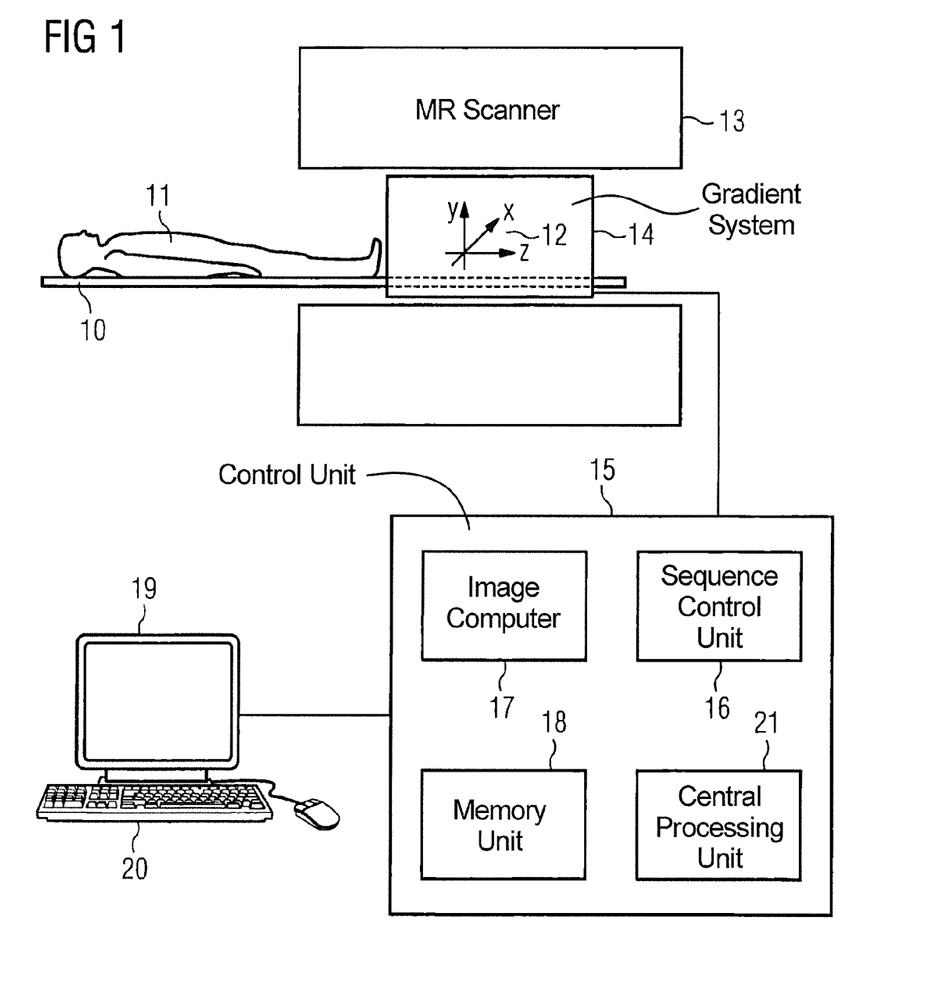
FIG. 1 schematically illustrates an MR system to implement a correction of distortions caused by the data acquisition occurring at different positions within the MR system.

An MR system with which the distortions can be corrected is schematically shown in FIG. 1. An examination person 11 arranged on a patient table is driven (moved) into the isocenter 12 of the scanner 13 (i.e., the isocenter of a gradient system 14 of the scanner). To acquire MR images, raw MR data of the examination subject 11 are acquired while said examination subject (situated on the table 10) is driven continuously through the scanner 13 or the isocenter 12. The coil used or the coils used for the signal detection are not shown in FIG. 1. The isocenter is the center point of the magnet 13. Nevertheless, deviations of the homogeneity of the $B_0$ field and nonlinearities of the gradient field that lead to artifacts in the image upon continuous movement of the table 10 during the measurement occur due to unavoidable variations of the $B_0$ field, due to eddy currents or local shieldings and due to susceptibility effects. The MR system is connected with a central control unit 15 which is used to control the image generation. The central control unit possesses a pulse sequence control unit 16 with which the sequence of the switching of the RF pulses and the gradients during the signal acquisition is controlled. The fact of how MR images can be generated via radiation of RF pulses and the switching of magnetic field gradients in three different spatial directions and the signal readout is familiar to the man skilled in the art and is not described in detail in the present invention. Furthermore, an image computer 17 is provided that generates an MR image from the detected raw data. Furthermore, a memory unit 18 and a display 19 with an operating unit 20 are provided to display the generated MR images or, respectively, for control of the system by an operator. The various units 16-20 are controlled with a central processing unit 21 (which can be a processor, for example). The correction of the distortions which occur due to the inhomogeneity of the $B_0$ field and the nonlinearity of the gradients and the calculation of the correction measures normally ensues with the aid of the image computer 17. As is explained below, the distortions can be due to a nonlinearity of the gradient field; however, the distortions can also have any other cause, wherein a knowledge of the cause of the distortions is not necessary in the present invention.

Figure 2:
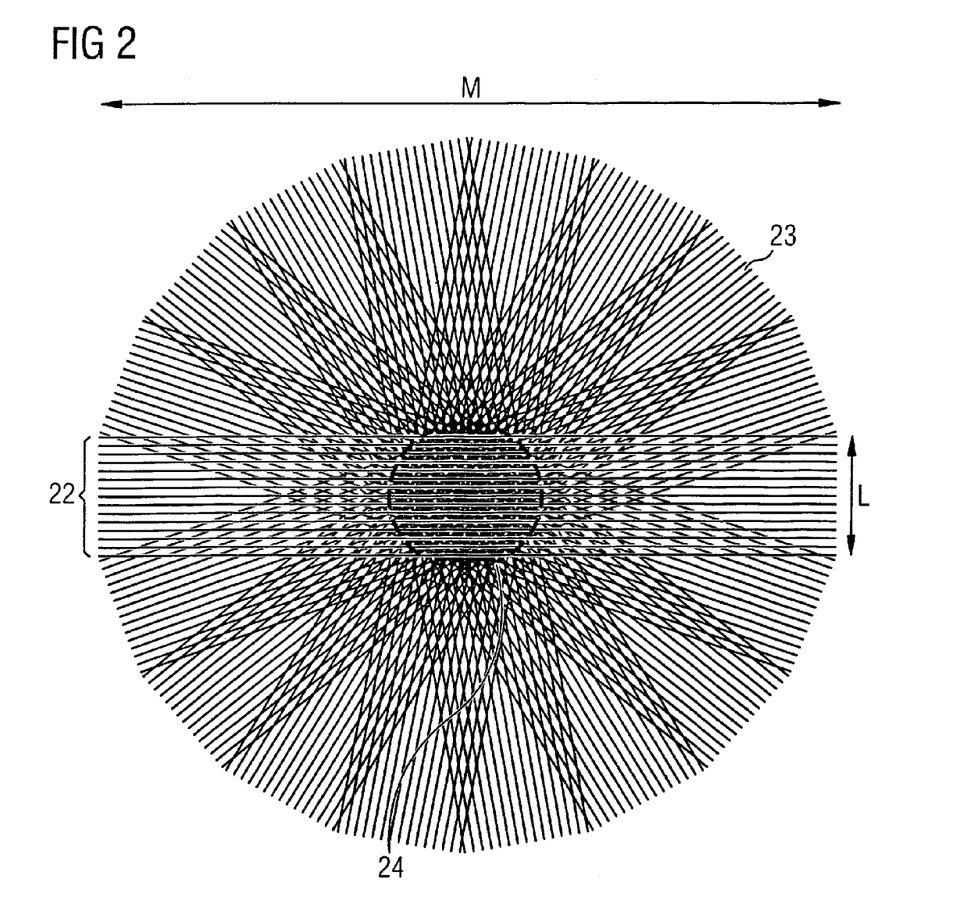
FIG. 2 illustrates the coverage of k-space in different segments in the PROPELLER technique.

The acquisition of k-space with a PROPELLER/BLADE technique that can be used in the present invention to generate the MR images is shown as an example in FIG. 2. The raw data space or k-space is acquired with a radially symmetrical acquisition technique in different segments 22 (in 9 different segments in total in the shown case), wherein each segment L has phase coding steps (15 in the present case). The signal readout respectively ensues over (throughout) the length M. The individual segments 22 are rotated such that a circular region of k-space is covered by the segments. Due to the radial acquisition technique with multiple segments 22, an intersection region 24 is formed inside, wherein this intersection region (that is likewise circular) is formed by the region that is measured by each segment in the acquisition of the different segments. The segments shown in FIG. 2 serve for the reconstruction of an MR image (or a slice) of the examination subject, wherein every segment is measured at a different position within the MR magnet due to the continuous movement of the table. The fact that measurement takes place at different positions within the MR system leads to inconsistencies between different segments and—insofar as these are not corrected—to distortions of the generated MR images. By comparison of the MR data within the intersection region 24, the distortions can now be calculated and thus can subsequently be taken into account in the image reconstruction in order to reduce the distortions in the generated MR image.

Figure 3:
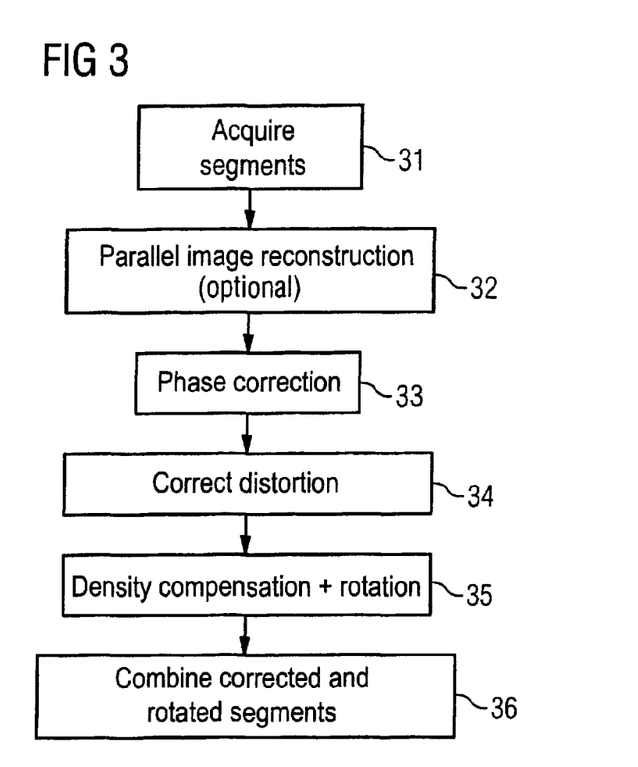
FIG. 3 is a flowchart for the creation of MR images with the PROPELLER technique and the correction of distortions.

The steps that can be used for reconstruction of an MR image assuming the acquisition scheme shown in FIG. 2 are schematically presented in FIG. 3. After the acquisition of the raw data of the individual segments 22 in Step 31, a parallel image reconstruction optionally ensues in Step 32 (which is described in United States Patent Application Publication No. 2008/0129289 A1, for example). A phase correction that is described in detail in "Motion Correction with PROPELLER MRI: Application to Head Motion and Free-Breathing Cardiac Imaging" by James G. Pipe in Magnetic Resonance in Medicine 42:963-969, 1999 can subsequently be implemented in Step 33. A correction of the distortions as it is explained in detail with reference to FIGS. 4-7 subsequently ensues in Step 34. As is apparent from the sequence of Steps 33 and 34, the phase correction ensues before the correction of the distortions in Step 34. Since—as is apparent in connection with FIG. 2—the data are acquired with a higher density in the k-space center than outside the k-space center, a density compensation must be conducted in Step 35. In order to be able to calculate the final image with a fast Fourier transformation, the data of the individual segments must be interpolated on a Cartesian grid. A particularly precise interpolation method in which the data of a segment are rotated with multiple successive "shearing" operations is described in the United States Patent Application Publication No. 2006/0264735, for example. In Step 36 the corrected and rotated segments are subsequently superimposed and transformed into the image space with a fast Fourier transformation. The MR images that are obtained in such a manner can either be directly displayed to the user or be subjected to additional processing steps beforehand.

Figure 4:
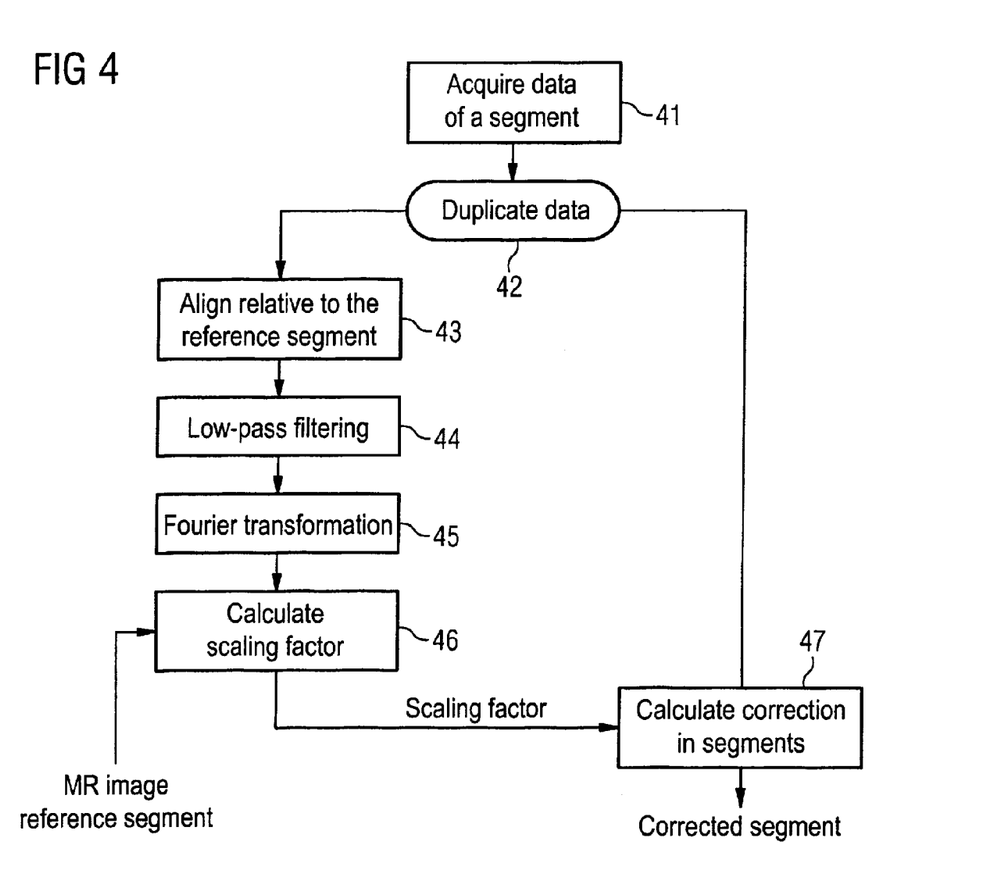
FIG. 4 is a flowchart with steps to correct the system-dependent distortions.

Step 34 from FIG. 3, with which the distortions can be corrected when the raw MR data are acquired with the PROPELLER technique given continuous displacement of the table, is shown in detail in FIG. 4. In the embodiment described in the following it is assumed that the acquisition of the segments at different positions within the MR system leads to a distortion, such that an MR image that is calculated based on the data of a segment is either enlarged or reduced so that the data of a segment coincide except for a scaling factor with the data of an unknown, ideal image, as is indicated above in Equation (1). This scaling factor depends on the z-position in the MR system at which the data of the segment were acquired, i.e. on the index number of the segment. If the scaling factors $a_j$ are known for all segments, an MR image can be calculated in which the distortions are reduced. Index j thereby numbers the segments. If the total number of segments is $N_B$, the index assumes values between 1 and $N_B$. The method from FIG. 4 begins with the acquisition of the individual raw data of a segment 22 (Step 41). $S_j(k_x,k_y)$ are the k-space data of a segment, wherein $I_j(x,y)$ is the discrete Fourier transformation of $S_j(k_x,k_y)$. The generated raw data are duplicated in Step 42, wherein a first version of the data is stored in order to use them in the further proceedings for image calculation while the second version of the data is used to calculate the distortions.

In one step (not shown), a segment is selected as a reference segment, wherein the scaling factor for this reference segment is set to 1, for example. It is possible to select any arbitrary segment as a reference segment; however it is advantageous to select the segment that was acquired at a z-position of the bed that has the least z-distance from the isocenter 12. In order to keep the depiction simple, in the following example it is assumed that the number of segments $N_B$ is even and that the segment with the segment index $j=N_B/2$ is used as a reference segment. Steps 43-46 operate exclusively with the second version of the segment data, even if this is not explicitly mentioned. It is also assumed that the second version of the reference segment has already run through Steps 43-45 and that the result of Step 45 has been stored.

In Step 43, the k-space data of the segment with index j are aligned relative to the reference segment. For example, this can ensue via rotation of the data around the k-space center with the angle $-(\alpha_j - \alpha_{N/2})$. $\alpha_j$ is the known rotation angle of the segment with the segment index j given an acquisition (for example $\alpha_j=(j-1)\cdot\pi/N_B$) and $\alpha_{N_B/2}$ is the known rotation angle of the reference segment (in the example: $\alpha_{N_B/2}=\pi\cdot(N_B/2-1)/N_B$). In Step 44 the k-space points are multiplied with a filter function. This filter function is selected such that data outside of the intersection region 24 are multiplied with zero. This corresponds to a low-pass filtering that blocks all frequencies outside of the region 24 from FIG. 2. The filter function $h(k_x,k_y)$ thus satisfies $h(k_x,k_y)=0$ in the event that $\sqrt{k_x^2+k_y^2} \geq L$. After low-pass filtering, the two raw data now exist aligned relative to one another in k-space. These could be compared with one another in k-space. In the present case, however, the comparison of the raw data ensues in position space so that in Step 45 the filtered raw data are Fourier-transformed, wherein $\tilde{I}_j(x,y)$ represents the image that was calculated from the rotated and low-pass-filtered raw data of the segment with the index j. After Step 45, a filtered frequency image and the previously stored filtered MR image of the reference segment now exist. Due to the continuous table movement, the two images were acquired at different positions within the MR system. In the embodiment shown here it is now assumed that the differences of the two images are to be ascribed exclusively to the imperfection of the MR system that is used. It is also assumed that these images differ only by a scaling factor. This is now determined in Step 46. For this a scaling factor $a_n$ from the search space is selected and a replica of $\tilde{I}_j(x, y)$ that is enlarged or, respectively, reduced by $a_n$ is calculated via interpolation:

$$\tilde{I}_{j,a_n}(x,y)=\tilde{I}_j(a_n x, a_n y) \qquad (2)$$

This is compared with the filtered reference image. For example, the comparison ensues via a formation of a correlation measure $C_{j,a_n}$ between the filtered reference image and the scaled replica $\tilde{I}_{j,a_n}(x,y)$. An example of such a correlation measure is the normalized cross-correlation $$C_{j,a_n} = \frac{\sum_x \sum_y \tilde{I}_{j,a_n}(x,y) \cdot \tilde{I}_{N_B/2}(x,y)}{\sqrt{\sum_x \sum_y \tilde{I}_{j,a_n}(x,y)} \sqrt{\sum_x \sum_y \tilde{I}_{N_B/2}(x,y)}} \qquad (3)$$

The sub-steps of selection of a scaling factor from the search space, calculation of the scaled replica of $\tilde{I}_j(x,y)$ via interpolation and calculation of the correlation measure between the scaled replica and the filtered reference image are repeated for different scaling factors from the search space, and the correlation measure is respectively stored.

The sought scaling factor for the segment j for $j \neq N_B/2$ is set equal to the scaling factor that maximizes the correlation measure in the search of all selected scaling factors:

$$a_j = \max_{\{\tilde{a}_n\}} C_{j,\tilde{a}_n} \quad (4)$$

In the simplest case, what is known as the exhaustive search, all scaling factors are thereby selected from the search space. Other search or, respectively, selection criteria that are computationally less complicated have been discussed further above. The selection of the search space is directed towards the deformations to be expected and the desired quality of the correction. One example is $\{0.9, 0.9 \div 1/256, 0.9 \div 2/256, 0.9 \div 3/256, \ldots, 1.1 - 1/256, 1.1\}$. In Step 47, the scaling factor calculated in Step 46 is applied to the first duplicate of segment j that is generated and stored in Step 42. The scaling of the first duplicate of segment j thereby ensues again via interpolation. Due to the scaling property of the Fourier transformation (Engl.: Fourier scaling property)

$$I(ax, ay) \leftrightarrow \frac{1}{|a|^2} s(k_x/a, k_y/a)$$

either the raw data of the segment can be directly scaled with the inverse factor or the interpolation ensues according to a Fourier transformation in position space. In the second case, the data are transformed back into k-space with an inverse Fourier transformation after the interpolation. At the end of Step 47, a corrected version of the segment j therefore exists whose scaling or, respectively, distortion corresponds at least approximately to that of the reference segment. As stated above, given a preferred selection the reference segment is characterized by particularly minimal distortions. The corrected version of the segment j is now handed off to the next processing step of the PROPELLER/BLADE reconstruction (Step 35 in FIG. 3). In the embodiment shown in FIGS. 3 and 4, Steps 35 and the subsequent Steps are unchanged relative to the conventional PROPELLER/BLADE reconstruction.

In the calculation of the scaling factor in Step 46 and in the correction of the segment data in Step 47, an interpolation is required between pixels or, respectively, k-space points. For this interpolation, any known interpolation method can be used (for example the bilinear interpolation) which uses the four nearest neighbors to calculate a pixel value at the new pixel position. An additional example is bicubic interpolation, in which the 16 nearest neighbors are taken into account. A particularly precise interpolation method is sinc interpolation. In sinc interpolation, the data are scaled via a fast discrete inverse Fourier transformation with different transformation lengths. However, the sinc interpolation is relatively slow (i.e. computationally complicated). Therefore, it is preferably used only in Step 47 while a particularly fast method such as bilinear interpolation is preferably used in Step 46, in which the interpolation is implemented repeatedly.

The most computationally complicated portion of the correction method (Step 34) is the repeated calculation of the scaled image and the correlation measure during Step 46. Given multiple acquisition channels, the numerical effort can be reduced via combination of the acquisition channels between Steps 45 and 46. For example, the combination can be calculated with the sum of squares algorithm:

$$\tilde{I}_j(x, y) = \sqrt{\sum_{c=1}^{N_C} \left| \text{Re}\{\tilde{I}_{j,c}(x, y)\} \right|^2} \quad (5)$$

In the above equation, $N_c$ is the number of acquisition channels and c is the channel index (that was previously not specified for reasons of clarity). Since, as shown in FIG. 3, a phase correction (Step 33) was implemented before the distortion correction (Step 34), the real portion and not the absolute value of the complex pixels is preferably squared and summed in Formula 5.

Figure 5:
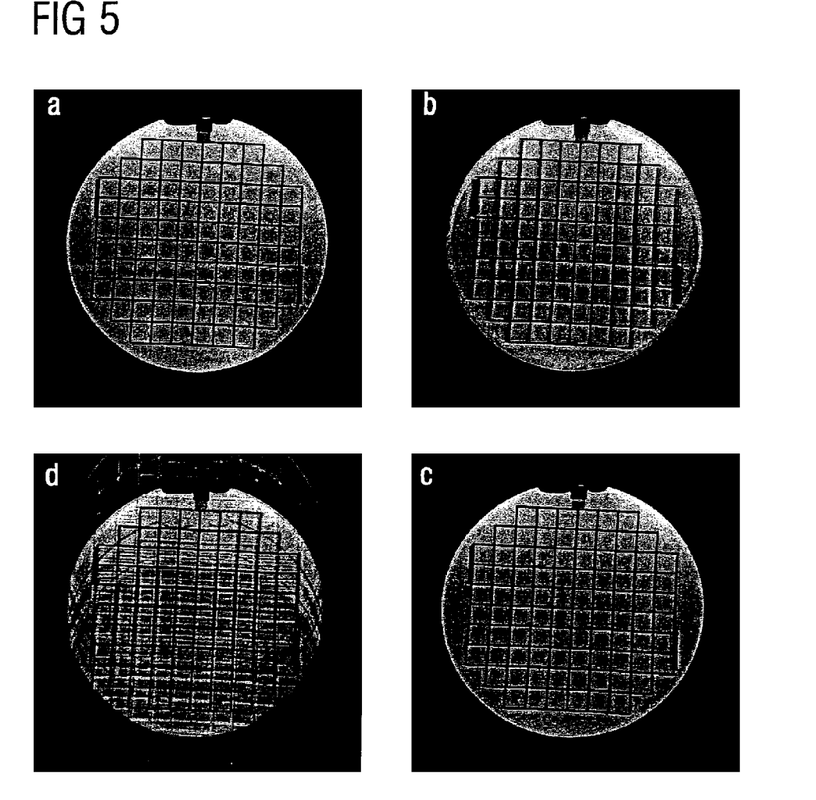
FIG. 5 shows MR images of a phantom with and without correction of the distortions.

The efficiency of the method according to the invention is shown with the images of a phantom presented in FIG. 5. The MR image of a phantom that was acquired with a turbo-spin echo sequence given a fixed table position is shown in FIG. 5a. This serves as a reference for the best possible achievable image quality. An MR image that was acquired with the PROPELLER/BLADE technique given a continuously moving table is shown in FIG. 5b. The distortion correction according to the invention that is described above was not implemented in FIG. 5b, meaning that Step 34 from FIG. 3 was omitted during the image reconstruction. The image in FIG. 5d was acquired with a conventional turbo-spin echo sequence given a moving table, again without correction. All additional sequence parameters have been selected identically or correspondingly as in the PROPELLER/BLADE sequence insofar as this is possible. The image FIG. 5c was acquired with the PROPELLER technique given continuous table feed, and the distortion correction as described in FIGS. 3 and 4 was implemented in the image reconstruction. Image 5b is more blurry in comparison to FIG. 5a. Image 5d is overlaid by more "ghosts" in comparison to image 5a. A comparison of FIGS. 5b and 5d shows that less disruptive artifacts, (i.e., artifacts that interfere less with the image impression) are generated solely by use of the PROPELLER/BLADE technique given measurement with continuous table feed. The comparison of FIGS. 5b and 5c shows that the artifacts/smears whose cause is the acquisition at different locations within the MR system can be distinctly reduced with the distortion correction according to the invention, and the image quality given a stationary table from FIG. 5a is nearly achieved.

Given a typical course of the image acquisition with continuous displacement of the table in the z-direction, a slice stack is repeatedly acquired. A specific segment of a slice of the stack is hereby typically acquired at the same z-position in all repetitions, wherein the position within the examination subject changes due to the table movement. In the event that the scaling factor depends primarily on the position within the MR system and not on the load, it is sufficient to calculate only one scaling factor per slice and segment (for example in the first repetition) and to also use this scaling factor for correction of the segments of the further repetitions that were acquired at the same z-position within the MR system.

Figure 6:
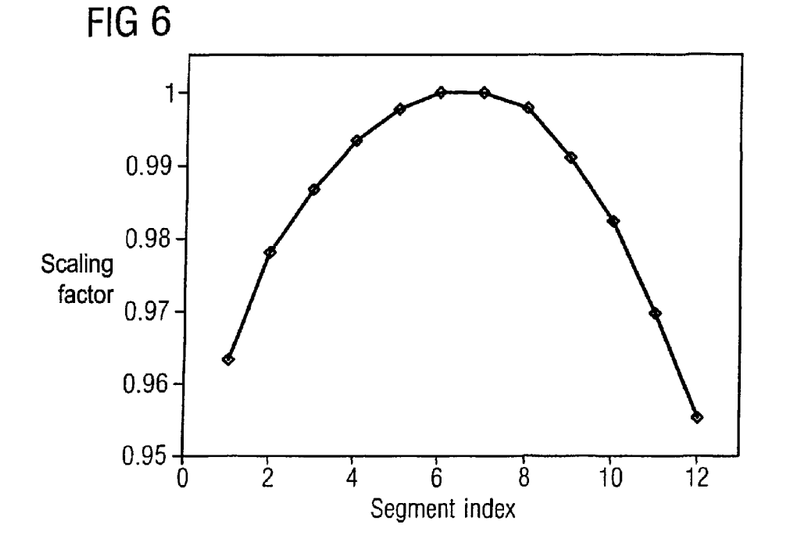
FIG. 6 is a graph that shows the scaling factor calculated with the method depending on the segment index.

The diamonds (rhombuses) in FIG. 6 show the calculated scaling factor for the image from FIG. 5c depending on the segment index. $N_B=12$ segments have been acquired in total. The sixth segment was used as a reference segment, and therefore the scaling factor of 1 was assigned to it. The other segments have been scaled with the respective shown scaling factors in order to reduce the distortions in the MR image.

Figure 7:
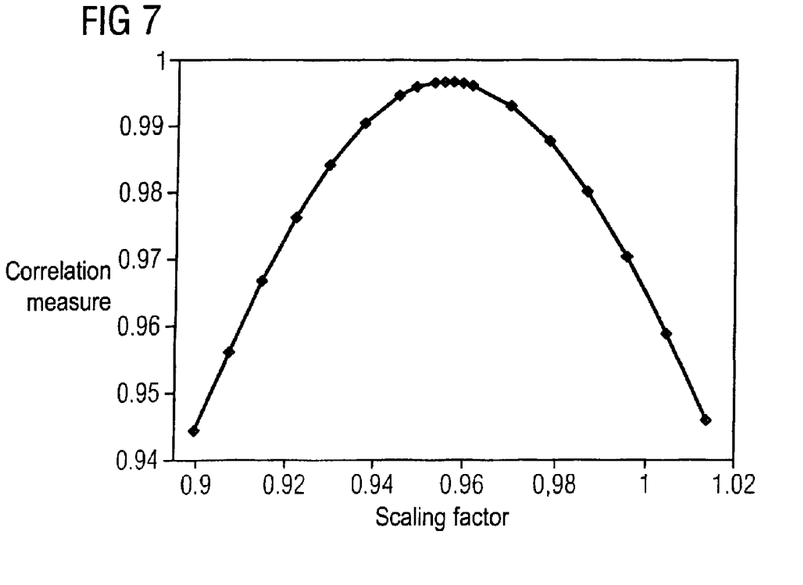
FIG. 7 is a graph that shows the degree of correlation depending on the scaling factor.

The correlation measure between the scaled replica of the filtered image of the segment with index 12 and the filtered image of the reference segment is shown in FIG. 7 as a function of the scaling factor. The diamonds shown in FIG. 7 mark the scaling factors for which the correction measure was calculated in Step 46 of the distortion correction. As is apparent from FIG. 7, the diamonds accumulate around the maximum. The reason is that a search method with shrinking intervals was used in order to reduce the necessary computation capacities. In the first iteration step of the method, every m-th element of the selected search space is selected, wherein $m=2^{N_{Iterations}-1}$ is the interval of the first iteration and $N_{Iterations}$ is the number of the iterations. In every additional iteration step, the interval is refined (halved in the example) relative to the preceding iteration step, and the search space is reduced by the local maxima of the earlier iteration steps. In FIG. 7 the search space contains scaling factors between 0.9 and 1.02.

Furthermore, the method described above for correction of the system-dependent homogeneity can be combined with a correction of the patient movement. Given the acquisition of MR images with the PROPELLER technique at a stationary table position, the comparison of the central k-space data can be used to determine the patient movement in the plane that occurred between the acquisition of different segments. A scaling factor is detected in the method presently described with continuous table displacement. It is now possible to calculate the movement of the examination subject and the scaling, wherein in this case the space to be searched is four-dimensional (two translation degrees of freedom, one rotation degree of freedom and one scaling degree of freedom).

It is known that the PROPELLER/BLADE technique given acquisition with stationary patient bed allows the determination of patient movement that ensues in the slice plane and occurs between the acquisition of different segments (see James G. Pipe, "Motion Correction with PROPELLER MRI: Application to Head Motion and Free-Breathing Cardia Imaging" in Magnetic Resonance in Medicine 42:963-969, 1999). In the present method it is shown that distortions whose cause is the data acquisition at different positions within the MR system can be detected and corrected given the acquisition with table feed. In both cases, the data in the intersection region of the segments can be used for detection. In the following it is shown how both a movement of the examination subject that occurs between the acquisition of the different segments and the scaling factors can be effectively determined given acquisition with table feed. For example, the simultaneous determination means that a two-dimensional translation and a rotation per segment is determined in addition to a scaling factor. The determination ensues as presented above in image space; this leads to a four-dimensional search space (two degrees of freedom of translation, one rotation angle and one scaling factor). This drastically increases the numerical cost of the method. In this case the search is advantageously directly conducted on the raw data of the segment in k-space. The absolute value of the k-space data does not change given, for example, a translation movement of the examination subject (known as "Fourier shift property"). This fact can be utilized in order to determine the rotation separate from the translation. For this the rotation is initially determined from the k-space absolute value data, and the translation is subsequently determined from the previously rotation-corrected complex k-space data. The separate determination of rotation and translation already significantly reduces the numerical cost. The rotation can also be ascribed to a displacement that is numerically simpler to handle if the k-space absolute value data are represented in polar coordinates. In the article "An FFT-Based Technique for Translation, Rotation, and Scale-Invariant Image Registration" by B. Srinivasa Reddy and B. N. Chatterji (IEEE Transactions on Image Processing, VOL. 5, NO. 8, August 1996) it is shown that, given an additional transition to logarithmic axes, the scaling corresponds to a displacement of the radial coordinate and the rotation corresponds to a displacement of the angle coordinate. This transformation allows the scaling factor and the rotation to be determined from the k-space absolute value data separate from the translation. After the scaling factor and the rotation angle of the segment are known, the complex data of the segment are corrected correspondingly and are subsequently used for translation detection. Scaling and movement of the examination subject can be effectively determined in this way.

In the previously shown embodiment, a single correction measure was determined per segment. If it is assumed that the nonlinearity of the gradient coil is the significant cause of the distortions, and if it is additionally assumed that the slice orientation occurs axially and the traverse of the bed occurs in the z-direction (thus is parallel to the image normal), this assumption means that only the nonlinearity of the gradient coil $G_z$ is corrected. Nonlinearities of the gradient coils $G_x$ and $G_y$ lead under the cited assumptions to distortions in the image plane. These can be at least partially corrected in another embodiment. For this the image plane of the filtered image of a segment is divided up into different regions and a scaling factor is respectively calculated for the different regions of the image. If the scaling factor is calculated in the image region, the image could be divided up into multiple concentric rings around the common isocenter of the gradient coils $G_x$ and $G_y$, for example. The determined scaling factor is henceforth a function of the segment index and the image region. In order to prevent discontinuities of the corrected image at the region borders, in the correction of a specific pixel of the segment a scaling factor is used that, for example, is a linear combination of the scaling factor that was determined for the image region to which the pixel belongs and the scaling factor that was determined for an adjacent image region.

Furthermore, the use of the method is possible along with the utilization of multiple acquisition coils, wherein the different coils typically have a very small sensitive volume. In one embodiment, an individual scaling factor can be determined for every segment and for every acquisition channel of the MR signal detection unit. The calculated scaling factor of an acquisition channel is then dependent on, for example, the nonlinearity of the gradient coils in the sensitivity range of the acquisition channel. The determination of different scaling factors for different acquisition channels is thus an additional method in order to account for nonlinearities of the gradient coil in the image plane. The segment data of one acquisition thus channel are corrected with its individual scaling factor before the combination of the individual acquisition channels.

The method described above is based on the assumption that the traverse of the table during the acquisition of a segment is small relative to the traverse that occurs in the acquisition of the entire image. However, this is assured since multiple segments (for example between 2 and 30 segments) are acquired for the entire data acquisition of an image. Given a T2-weighted turbo-spin echo sequence, a segment is acquired with an echo train whose duration is less than 300 ms. In contrast to this, the time between the acquisition of two successive segments is one TR, thus typically between 2000 and 12000 ms. For this reason the traverse of the table during the acquisition of one segment (and therefore the distortion) is negligible.

Relative to all known distortion correction methods, the invention described above for the correction of the distortions in measurements during continuous table feed has the advantage that the correction factors do not need to be known before the measurement since they are calculated directly from the image data. It is thereby no longer necessary to generate correction maps for correction of the nonlinearities for gradient systems as it was necessary in the prior art. In particular, the method is therefore not limited to a specific design of the gradient coil. Furthermore, in the present method no assumption of the cause of the distortion is made. The present invention detects and therefore reliably corrects system-dependent distortions that lead to the assumed variations of the segment, for example enlargement or shrinking.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for correcting image distortions that occur in a magnetic resonance image due to acquisition of magnetic resonance data for generating the magnetic resonance image at different positions within a magnetic resonance data acquisition unit, said method comprising the steps of:

continuously moving a patient on a patient table through an isocenter of a magnetic resonance data acquisition unit comprising a gradient coil that produces a gradient filed that exhibits imperfect linearity around said isocenter and, with said magnetic resonance data acquisition unit, acquiring raw magnetic resonance data from respective successive regions of the patient as the patient is moved on said moving table through the isocenter, said raw magnetic resonance data exhibiting encoding imperfections due to said patient moving with said patient table through said gradient field that exhibits said imperfect linearity, and entering said raw magnetic resonance data in multiple segments in k-space using a radial filling trajectory;

in a processor, automatically determining a non-punctiform intersection region in a center of k-space simultaneously covered by said multiple segments;

in said processor, calculating distortion, due to said imperfect encoding dependent on the intersection region of at least two different segments among said multiple segments; and in said processor, reconstructing a magnetic resonance image based on said raw magnetic resonance data and correcting the calculated distortion in the reconstructed magnetic resonance image, and making the reconstructed magnetic resonance image available as a data file at an output of the processor.

2. A method as claimed in claim 1 comprising, in said processor, designating one of said multiple segments as a reference segment, and determining said intersection region of said reference segment and at least one additional segment, among said multiple segments, by comparing said reference segment with said at least one additional segment, to obtain a comparison result, and calculating said distortion dependent on said comparison result.

3. A method as claimed in claim 2 comprising, in said processor, selecting said at least one additional segment as a segment among said multiple segments that is aligned parallel to said reference segment, and calculating a correction measure from said comparison result, and correcting said at least one additional segment with said correction measure.

4. A method as claimed in claim 3 comprising Fourier transforming the intersection region of the reference segment to generate a filtered reference image and Fourier transforming the intersection region of said at least one additional segment to generate at least one additional filtered image, and comparing said filtered reference image with said at least one additional filtered image to obtain said comparison result for calculating said correction measure.

5. A method as claimed in claim 3 comprising calculating said correction measure for every segment among said multiple segments, except for said reference segment, and correcting every additional segment with the respective correction measure calculated for that additional segment.

6. A method as claimed in claim 3 comprising combining all of said additional segments, corrected with the respective correction measures, into corrected raw magnetic resonance data, and reconstructing said magnetic resonance image from said corrected raw magnetic resonance data.

7. A method as claimed in claim 3 comprising generating said correction measure as a scaling factor that enlarges or reduces an image calculated from corrected data for that segment.

8. A method as claimed in claim 7 comprising calculating said enlarged or reduced images by interpolation.

9. A method as claimed in claim 7 comprising determining said scaling factor for each segment as a correlation measure between the additional filtered magnetic resonance image scaled with a scaling factor, and the filtered reference image.

10. A method as claimed in claim 9 comprising determining the scaling factor for at least one additional segment by maximizing the correlation measure as a function of the scaling factor.

11. A method as claimed in claim 10 comprising determining a separate scaling factor for each segment and for each acquisition channel of said magnetic resonance system.

12. A method as claimed in claim 11 comprising maximizing said correlation measure in an iteration measurement with a decreasing interval among said scaling factors.

13. A method as claimed in claim 7 comprising for at least one of said additional segments, calculating different scaling factors for different regions of the magnetic resonance image of that segment.

14. A method as claimed in claim 13 comprising maximizing said correlation measure in an iteration measurement with a decreasing interval among said scaling factors.

15. A method as claimed in claim 2 wherein said magnetic resonance system is configured according to a Cartesian coordinate system and wherein said patient is moved along a z-axis of said Cartesian coordinate system, and wherein said magnetic resonance system comprises a gradient system having an isocenter, and wherein said method comprises selecting said reference segment as a segment, among said multiple segments, having a position along said z-axis that has a smallest distance from said isocenter.

16. A method as claimed in claim 1 comprising determining a movement of the examination subject between acquisition of said different segments, in addition to determining said distortion.

17. A method as claimed in claim 1 comprising radially filling k-space with said raw magnetic resonance data according to a PROPELLER technique.

18. A magnetic resonance system for correcting image distortions that occur in a magnetic resonance image due to acquisition of magnetic resonance data for generating the magnetic resonance image at different positions within a magnetic resonance data acquisition unit, comprising:

- a magnetic resonance data acquisition unit having an isocenter, and comprising a gradient coil that produces a gradient filed that exhibits imperfect linearity around said isocenter;
- a patient table moveable through said magnetic resonance data acquisition unit and adapted to receive a patient thereon;
- a k-space memory;
- a control unit configured to operate said patient table and said magnetic resonance data acquisition unit to continuously move a patient on the patient table through the magnetic resonance data acquisition unit and, with said magnetic resonance data acquisition unit, to acquire raw magnetic resonance data, encoded by said gradient field, from respective successive regions of the patient as the patient is moved on said moving table through the isocenter, said raw magnetic resonance data exhibiting encoding imperfections due to said patient moving with said patient table through said gradient field that exhibits said imperfect linearity, and entering said raw magnetic resonance data in multiple segments, respectively for said successive regions of the patient, in k-space in said k-space memory using a radial filling trajectory;
- a processor configured to automatically determine a non-punctiform intersection region in a center of k-space in said k-space memory simultaneously covered by said multiple segments, and to calculate, due to said imperfect encoding, distortion dependent on the intersection region of at least two different segments among said multiple segments; and
- an image computer configured to reconstruct a magnetic resonance image based on said raw magnetic resonance data and correct the calculated distortion in the reconstructed magnetic resonance image, and to make the reconstructed magnetic resonance image available as a data file at an output of said image computer.

* * * * *